(12) United States Patent
Hoshi et al.

(10) Patent No.: US 7,396,405 B2
(45) Date of Patent: Jul. 8, 2008

(54) SINGLE CRYSTAL, SINGLE CRYSTAL WAFER, EPITAXIAL WAFER, AND METHOD OF GROWING SINGLE CRYSTAL

(75) Inventors: Ryoji Hoshi, Fukushima (JP); Susumu Sonokawa, Fukushima (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 277 days.

(21) Appl. No.: 10/525,244

(22) PCT Filed: Sep. 8, 2003

(86) PCT No.: PCT/JP03/11443

§ 371 (c)(1),
(2), (4) Date: Feb. 22, 2005

(87) PCT Pub. No.: WO2004/025001

PCT Pub. Date: Mar. 25, 2004

(65) Prior Publication Data

US 2005/0263062 A1 Dec. 1, 2005

(30) Foreign Application Priority Data

Sep. 13, 2002 (JP) ............................. 2002-267563

(51) Int. Cl.
*C30B 15/00* (2006.01)
*C30B 21/06* (2006.01)
*H01L 21/461* (2006.01)

(52) U.S. Cl. ............................. 117/13; 117/30; 117/32; 117/36; 438/692

(58) Field of Classification Search .................. 117/13, 117/30, 32, 36; 438/692
See application file for complete search history.

(56) References Cited

U.S. PATENT DOCUMENTS 4,944,834 A 7/1990 Tada et al.

(Continued)

FOREIGN PATENT DOCUMENTS

EP 0 172 621 A2 2/1986

(Continued)

OTHER PUBLICATIONS

J. Mayer and S. S. Lau, Electronic Materials Science: For Integrated Circuits in Si and GaAs, 1990, Macmillan Publishing, pp. 30-33 and 44.*

*Primary Examiner*—Robert M. Kunemund
*Assistant Examiner*—G. Nagesh Rao
(74) *Attorney, Agent, or Firm*—Oliff & Berridge, PLC

(57) ABSTRACT

There is disclosed a single crystal obtained by a single crystal pulling method, wherein an interval of striations incorporated into the single crystal due to temperature fluctuation of crystal melt at the time of crystal growth is controlled, and a method of growing a single crystal according to a single crystal pulling method, wherein a growth rate and/or a temperature fluctuation period are controlled so that $V \times F / \sin \theta$ may be in a certain range when a growth rate at the time of growing a single crystal is defined as V (mm/min), a temperature fluctuation period of crystal melt is defined as F (min), and an angle to the level surface of a crystal-growth interface is defined as $\theta$. Thereby nanotopology characteristics can be improved from aspects different from the processing conditions of the surface of the wafer and there can be provided a single crystal which can produce a wafer excellent in nanotopology characteristics, especially in nanotopology characteristics measured in 2 mm×2 mm square, and a method of growing a single crystal for growing the single crystal.

10 Claims, 5 Drawing Sheets

U.S. PATENT DOCUMENTS

| | | | |
|---|---|---|---|
| 5,285,460 A | 2/1994 | Ueda et al. | |
| 6,117,231 A * | 9/2000 | Fusegawa et al. | 117/30 |
| 6,200,384 B1 | 3/2001 | Kishida et al. | |
| 7,077,726 B2 * | 7/2006 | Pietsch et al. | 451/41 |
| 2001/0041258 A1 * | 11/2001 | Passek et al. | 428/332 |
| 2003/0060050 A1 * | 3/2003 | Pietsch et al. | 438/692 |
| 2004/0229548 A1 * | 11/2004 | Kann et al. | 451/28 |

FOREIGN PATENT DOCUMENTS

| | | |
|---|---|---|
| EP | 0 466 457 A1 | 1/1992 |
| EP | 0 953 658 A1 | 11/1999 |
| EP | 1 035 236 A1 | 9/2000 |
| JP | A-2001-127016 | 5/2001 |
| JP | A-2001-326228 | 11/2001 |
| JP | A-2002-141311 | 5/2002 |
| WO | WO 02/10485 A1 | 2/2002 |

* cited by examiner

INTENSITY OF MAGNETIC FIELD (G)

STRIATIONS IN A SINGLE CRYSTAL

WAFER

SINGLE CRYSTAL, SINGLE CRYSTAL WAFER, EPITAXIAL WAFER, AND METHOD OF GROWING SINGLE CRYSTAL

TECHNICAL FIELD

The present invention relates to a material used for a semiconductor device, and specifically relates to a single crystal which can produce a wafer excellent in nanotopology characteristics, a method for growing the single crystal, a single crystal wafer cut from the single crystal, and an epitaxial wafer wherein an epitaxial layer is formed on the surface of the single crystal wafer.

BACKGROUND TECHNOLOGY

An epitaxial wafer is one of the material used for a semiconductor device. The epitaxial wafer is, for example, the wafer wherein epitaxial growth of silicon is conducted on a silicon single crystal wafer, and has been widely used for many years as a wafer for manufacture of an individual semiconductor, a bipolar IC, or the like because of the outstanding characteristics. Moreover, MOS LSI have also been used as a microprocessor unit or a flash memory device since they are excellent in a soft error and latch up characteristics. An example of excellent characteristics of the epitaxial wafer is that a deterioration in reliability of DRAM or the like may be decreased since there is substantially no so-called Grown-in defect introduced at the time of manufacture of a single crystal in an epitaxial layer, and thus the need for it has been increasingly expanded.

Especially importance of an epitaxial wafer wherein epitaxial growth is conducted on a low resistivity wafer having a resistivity of 0.1 Ω·cm or less as a substrate has been increasingly raised, since it is excellent in latch up characteristics and the substrate has a gettering capacity.

On the other hand, in recent years, when metal wiring is formed on a wafer, an insulator film is formed on it, the insulator film is made plane by chemical mechanical polishing (CMP), and a metal oxide film and the 2nd metal wiring are formed on it in a manufacturing process of a semiconductor-device, it has been considered that unevenness of nano meter order in a very small area called nanotopology which exists on the polished surface of the above-mentioned wafer (which is also called nanotopography) is one of causes of loss of uniformity in a thickness of an insulator film and a poor breakdown voltage and it has come to be regarded as a problem among device makers.

The nanotopology is a shape of surface of a wafer within frequency longer than microroughness and shorter than flatness, and covers unevenness within a wavelength of around 0.1 mm to 20 mm and an amplitude of around several nm to 100 nm.

Moreover, as to planarity of the surface of the wafer, planarization has been progressed by request of lithography. With a tendency that a line width of lithography becomes finer as 0.18 μm or less due to high integration of a semiconductor device in recent years, nanotopology has been come into question. Furthermore, also in the case that STI (Shallow Trench Isolation) is filled with an insulator film and a surface is polished, it has been becoming indispensable to improve not only homogeneity of polishing of the CMP itself but also the nanotopology of a wafer itself.

Therefore, research and study of nanotopology are performed at any place not only at a device maker, but also at a material maker, a public organization and academic circles, and active argument has been developed as to a method for measuring, a quantitative definition or the like at present. However, although the nanotopology is recognized as above, it has not come to the stage where the completely unified official standard as to a measuring method and a quantitative definition of nanotopology are established.

One of the evaluation methods of the nanotopology mainly performed now is a method of evaluating difference of elevation of the unevenness on the surface of a wafer (P-V value: Peak to Valley) in the region of about 0.1 to 10 mm square or in the region of a circle with a diameter of about 0.1 to 10 mm (which is also referred to as WINDOW SIZE or the like). The P-V value is also called Nanotopography Height or the like. In evaluation of the semiconductor wafer by the nanotopography, it is especially desired that the maximum of the unevenness which exists in a plane of the wafer is small, measurement is usually performed in two or more block areas of 2 mm×2 mm square, and the maximum of the P-V value is used to evaluate the wafer. If the maximum of the P-V value is smaller, the wafer is evaluated as more excellent in quality.

Such measurement of nanotopology has been performed by WIS-CR83-SQM or NanoMapper manufactured by ADE Corporation, Surfscan-SP1-STN manufactured by KLA-Tencor Corporation, DynaSearch manufactured by New creation Corporation, NanoMetro manufactured by Kuroda Seikosha Corporation, or the like. In all of these apparatuses for measurement, measurement of unevenness is conducted optically using reflection from a surface.

Generally, such nanotopology on a surface of a wafer is considered to be determined by etching conditions, polishing conditions, or the like in a processing process of the surface of the wafer. Therefore, improvement of nanotopology characteristics is attempted mainly by studying processing conditions of the surface of the wafer, since it has been recognized to be the problem of CMP in processing of the surface of the wafer, for example, as indicated in Japanese Patent Application Laid-open (kokai) No. 2002-141311, and it is hardly attempted from the point other than processing condition of the surface of the wafer.

From now on, still severer nanotopology characteristics will be required as standard as a device size becomes still finer. Especially as to the material which bears the next generation, it is clear that it is used in the line of the latest very fine lithography, and that the wafer which has an excellent nanotopology characteristics comes to be requested inevitably.

Therefore, it is necessary that nanotopology characteristics is improved not only by the processing conditions of the surface of a wafer as before, but also from other aspects, to manufacture the wafer with very excellent nanotopology characteristics.

DISCLOSURE OF THE INVENTION

The present invention has been made in order to solve such problems. The object of the present invention is to improve nanotopology characteristics from aspects different from the processing conditions of the surface of the wafer, and to provide a single crystal which can produce a wafer excellent in nanotopology characteristics, especially nanotopology characteristics measured in 2 mm×2 mm square, a single crystal wafer cut from the single crystal, an epitaxial wafer wherein an epitaxial layer is formed on the surface of the single crystal wafer and a method of growing a single crystal for growing the single crystal.

In order to achieve the above-mentioned objects, the present invention provides a single crystal obtained by a single crystal pulling method wherein an interval of striations incorporated into the single crystal due to temperature fluctuation of crystal melt at the time of crystal growth is controlled.

The inventors of the present invention have newly found out that nanotopology characteristics on a surface of a wafer are influenced by an interval of striations incorporated into a single crystal due to temperature fluctuation of crystal melt at the time of crystal growth. Therefore, as described above, as to a single crystal obtained by the single crystal pulling method, if the interval of the striations incorporated into the single crystal due to temperature fluctuation of crystal melt at the time of growing the crystal is controlled, it is the single crystal from which an excellent single crystal wafer with controlled nanotopology characteristics can be cut.

At this time, it is desirable that the above-mentioned interval of striations is controlled in the range of 1.5 mm or less or 2.3 mm or more in a plane perpendicular to an axis of crystal growth.

As described above, if the interval of the striations incorporated into a single crystal is controlled in the range of 1.5 mm or less or 2.3 mm or more in a plane perpendicular to an axis of crystal growth, the single crystal from which the single crystal wafer wherein the nanotopology level in the area of the 2 mm×2 mm square which is mainly measured at present is very excellent can be cut can be obtained.

Furthermore, it is preferable that the above-mentioned single crystal is silicon and the resistivity thereof is 0.1 Ω·cm or less.

The inventor of the present invention have studied further as to nanotopology characteristics, and found that although the conventional low resistivity single crystal wafer is excellent in gettering capacity, degradation of nanotopology under the influence of striations is serious by the action of the dopant added in order to control resistivity. Therefore, if the single crystal of the present invention is silicon as mentioned above, and the resistivity is low as 0.1 Ω·cm or less, degradation of nanotopology can be surely prevented, and the single crystal which can provide a wafer which is excellent in gettering capacity, and is very excellent also in nanotopology characteristics can be obtained, and thus it is very useful.

Moreover, a diameter of the above-mentioned silicon single crystal can be 200 mm or more.

Generally, as to a large diameter crystal with a diameter of 200 mm or more, crystal growth at a certain high speed is difficult, and it is grown at a bit lower speed range in many cases. Consequently, nanotopology characteristics is inevitably degraded in the large diameter crystal, especially in the crystal with a diameter of 200 mm or more. Since it has been found that nanotopology characteristics can be improved by increasing a growth rate to some extent in the present invention, a wafer which has excellent nanotopology characteristics can be obtained even from a single crystal with a diameter of 200 mm or more. Moreover, to improve nanotopology characteristics by increasing a growth rate means that not only improvement in quality but also improvement in productivity can be achieved.

According to the present invention, there can be provided a single crystal wafer which is cut from the above-mentioned single crystal of the present invention. At this time, there can be obtained the single crystal wafer wherein an average of the maximum of the nanotopology level in the area of a 2 mm×2 mm square is 14 nm or less over the whole surface of the wafer.

Such a single crystal wafer of the present invention can be a high quality wafer having excellent nanotopology characteristics. Especially, it can be a single crystal wafer, when nanotopology level in the area of a 2 mm×2 mm square is measured over the whole surface of the wafer, an average of the maximum of nanotopology level achieves a good level as 14 nm or less.

Furthermore, according to the present invention, there can be provided an epitaxial wafer wherein an epitaxial layer is formed on the surface of the above-mentioned single crystal wafer of the present invention. At this time, an average of the maximum of the nanotopology level in the area of a 2 mm×2 mm square can be 14 nm or less over the whole surface of the wafer of the above-mentioned epitaxial wafer.

Since the nanotopology characteristics in an epitaxial wafer reflects the nanotopology characteristics of a substrate, if it is an epitaxial wafer wherein epitaxial layer is formed on the surface of the single crystal wafer of the present invention as a substrate as mentioned above, it can be excellent in nanotopology characteristics. Especially, when the 2 mm ×2 mm square nanotopology level of the epitaxial wafer is measured over the whole epitaxial wafer surface, an average of the maximum of nanotopology level achieves a good level as 14 nm or less. Furthermore, since generation of the internal stress (distortion) due to unevenness between a single crystal wafer surface and an epitaxial layer is little in an epitaxial wafer excellent in nanotopology characteristics, there is no generation of a slip line in the epitaxial layer. Consequently, it can be the epitaxial wafer which has a strong thermal mechanical strength in manufacture of the device. Especially, it comes to have a high gettering capacity due to misfit if the single crystal wafer with low resistivity of 0.1 Ω·cm or less is used as a substrate. Furthermore, if it is the wafer with low resistivity, latch up characteristics are also excellent.

Moreover, according to the present invention, there can be provided a method of growing a single crystal according to a single crystal pulling method wherein a growth rate and/or a temperature fluctuation period are controlled so that V×F/sin θ may be in a certain range when a growth rate at the time of growing a single crystal is defined as V (mm/min), a temperature fluctuation period of crystal melt is defined as F (min), and an angle to the level surface of a crystal-growth interface is defined as θ.

As described above, when a single crystal is grown by a single crystal puling method, if a growth rate and/or a temperature fluctuation period are controlled so that V×F/sin θ may be in a certain range as to a growth rate V, a temperature fluctuation period of crystal melt F, and an angle to the level surface of a crystal-growth interface θ, an interval of the striations incorporated into a single crystal due to temperature fluctuation of crystal melt at the time of growing a crystal can be controlled in a suitable size. Therefore, there can be produced a single crystal from which the outstanding single crystal wafer wherein nanotopology characteristics is controlled can be cut. In addition, V×F/sin θ corresponds to the interval of the striations due to temperature fluctuation of the melt in the plane perpendicular to an axis of crystal growth, as described later.

At this time, it is desirable that the single crystal is grown so that the above-mentioned V×F/sin θ may be in the range of 1.5 mm or less or 2.3 mm or more.

As described above, if V×F/sin θ is in the range of 1.5 mm or less or 2.3 mm or more when the single crystal is grown, there can be produced a single crystal from which the single crystal wafer having a very excellent nanotopology level in a 2 mm×2 mm square can be cut.

Furthermore, it is desirable that the above-mentioned single crystal to be grown is silicon, and resistivity thereof is set to 0.1 Ω·cm or less.

As described above, if the single crystal to be grown according to the present invention is silicon, and resistivity thereof is set to 0.1 Ω·cm or less, degradation of the nanotopology which poses a problem in a low resistivity single crystal can be prevented, and there can be produced a single crystal from which the wafer having an excellent gettering capacity and excellent nanotopology characteristics can be cut.

Moreover, it is desirable to control the above-mentioned temperature fluctuation period of crystal melt by controlling any one item or more of an intensity of magnetic field to be impressed to crystal melt, a crucible rotation rate, a single crystal rotation rate, a gas flow rate, and an amount of crystal melt.

As described above, if a temperature fluctuation period is controlled by controlling any one item or more of an intensity of magnetic field to be impressed to crystal melt, a crucible rotation rate, a single crystal rotation rate, a gas flow rate, and an amount of crystal melt, the temperature fluctuation period can be controlled easily and with high precision.

As explained above, according to the present invention, nanotopology characteristics can be improved by controlling an interval of the striations incorporated into a single crystal by control of growing condition of a single crystal. Therefore, there can be provided a single crystal from which a wafer excellent in nanotopology characteristics, especially excellent in nanotopology characteristics in the area of 2 mm×2 mm square can be cut, a single crystal wafer cut from the single crystal, and a epitaxial wafer wherein an epitaxial layer is formed on the single crystal wafer. Furthermore, the epitaxial wafer of the present invention is excellent in a thickness uniformity of an epitaxial layer, and a high yield in an LSI device can be expected.

BEST MODE FOR CARRYING OUT THE INVENTION

Figure 1:
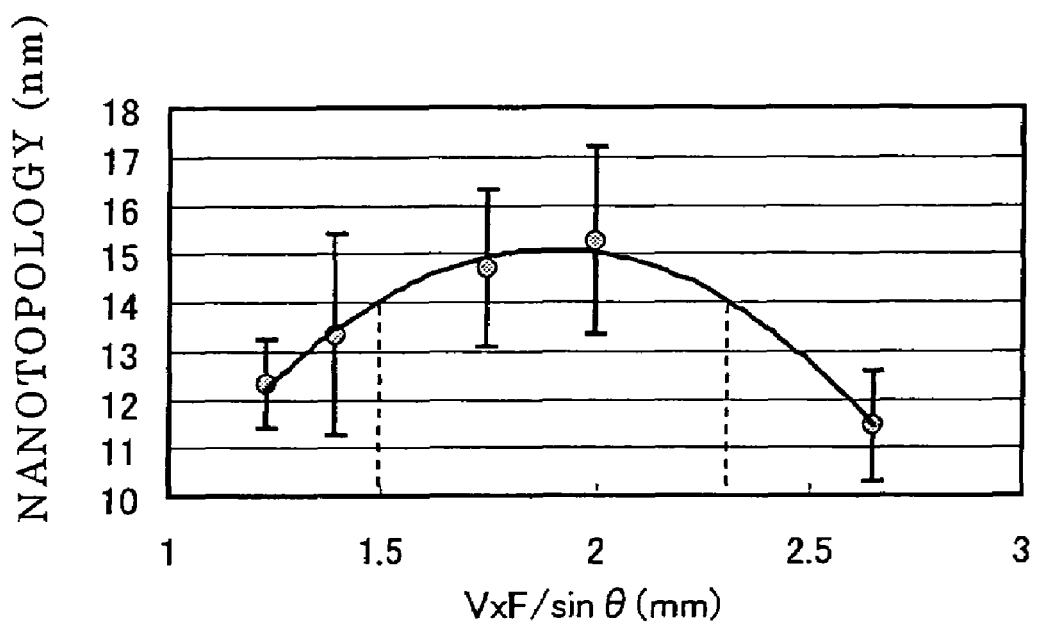
FIG. 1 is a graph showing the relation between V×F/sin θ and nanotopology level.

The present invention will be explained below in mode for carrying out, but the present invention is not limited thereto.

It has been considered conventionally that nanotopology characteristics are mainly determined by etching conditions, polishing conditions, or the like in a processing process of the surface of a wafer, and it has not been attempted to improve nanotopology characteristics from aspects other than wafer surface processing.

The inventors of the present invention have repeated research as to nanotopology characteristics of a single crystal wafer in order to improve nanotopology characteristics from various aspects. Consequently, they found that degradation of nanotopology characteristics of a single crystal wafer is caused in the case that the interval of the striations incorporated into the single crystal due to temperature fluctuation of crystal melt at the time of growing a crystal when growing a single crystal is close to the size of the measurement area at the time of measuring nanotopology.

Especially, although a conventional silicon single crystal with low resistivity in which boron, phosphorus, or the like is doped has an advantage that it is excellent in a gettering capacity, an amount of the dopant which controls resistivity is a lot, and thus a hardness of a wafer is high, consequently the heterogeneity of concentration of the dopant causes difference in a hardness of a single crystal, which may easily lead to minute unevenness on the surface of the silicon wafer cut from the single crystal. Therefore, it has been revealed that degradation of the nanotopology caused by the striations due to a crystal-growth is very serious in the conventional silicon single crystal with low resistivity.

Then, the inventors of the present invention have found that improvement of nanotopology characteristics can be achieved even from aspects other than wafer surface processing, by controlling the interval of the striations due to temperature fluctuation of crystal melt to be in a certain range when growing a single crystal, namely in a different range from a size of the measurement area when nanotopology is measured, and completed the present invention.

That is, according to the present invention, there is provided a single crystal obtained by a single crystal pulling method wherein an interval of striations incorporated into a single crystal due to temperature fluctuation of crystal melt at the time of crystal growth is controlled.

Furthermore, the present invention provides as a method for growing the above-mentioned single crystal a method of growing a single crystal according to a single crystal pulling method wherein a single crystal is grown with controlling a growth rate and/or a temperature fluctuation period so that V×F/sin θ may be in a certain range when a growth rate at the time of growing a single crystal is defined as V (mm/min), a temperature fluctuation period of crystal melt is defined as F (min), and an angle to the level surface of a crystal-growth interface is defined as θ.

Although the method of growing a single crystal of the present invention will be explained in detail below, referring to drawings, the present invention is not limited to them.

Figure 10:
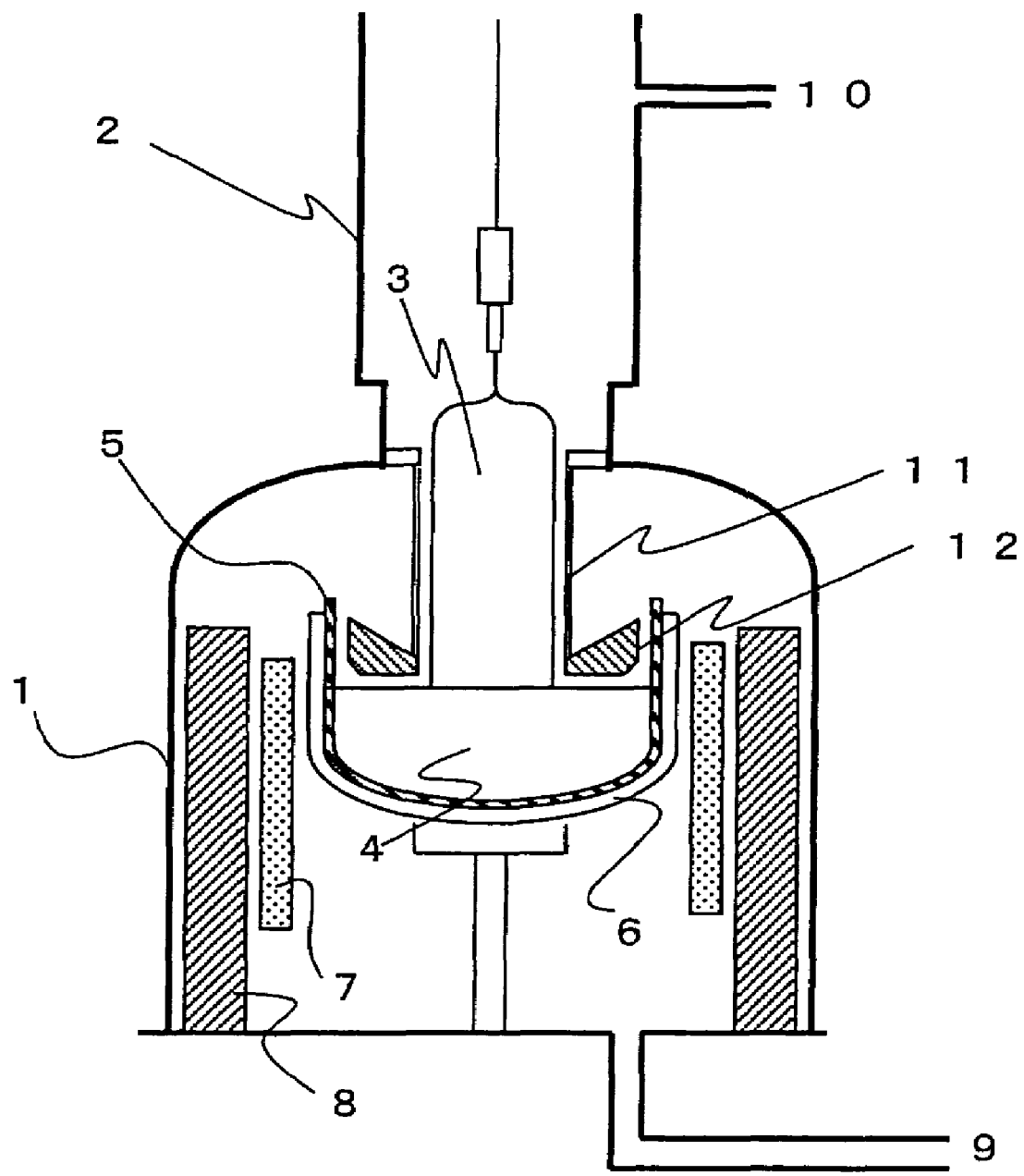
FIG. 10 is a schematic view of the apparatus for growing a single crystal used in the present invention.

Although the apparatus for growing a single-crystal used in the method of growing a single crystal of the present invention is not especially limited, the apparatus for growing a single crystal as shown in FIG. 10 can be used, for example. The apparatus for growing a single crystal for performing a method of growing a single crystal of the present invention will be explained referring to FIG. 10 below.

The apparatus for growing a single crystal of FIG. 10 is equipped with a quartz crucible 5 in which crystal melt 4 is put, a graphite crucible 6 which protects the quartz crucible 5, a heating heater 7 and a heat insulating material 8 arranged so that they may surround the crucibles 5 and 6 installed in a main chamber 1, the grown single crystal 3 is contained in the upper part of the main chamber 1 and the pull chamber 2 for taking out the grown single crystal 3 is connected thereto.

When a single crystal 3 is grown using such an apparatus for growing a single crystal, a seed crystal is immersed in crystal melt 4 in the quartz crucible 5, it is quietly pulled with being rotated to grow a cylindrical single crystal 3 through necking according to Czochralski method (CZ method). On the other hand, the crucibles 5 and 6 can be moved up and down along a growing axis of a crystal, the crucibles are raised to compensate lowered distance of liquid surface of melt which is decreased as a result of crystallization during crystal growth. Thereby, the height of the surface of the melt is made constant. Into the main chamber 1, inert gas such as argon gas or the like is introduced from the gas inlet opening 10 provided in the upper part of the pull chamber 2, the inert gas passes between the single crystal 3 which is being pulled and a gas flow guide cylinders 11, passes between the lower part of a heat insulating part 12 and a surface of a melt, and is discharged from a gas outlet opening 9. Furthermore, using a radiation thermometer (un-illustrated), a temperature of the crystal melt 4 in the quartz crucible 5 is measured from radiation of crystal melt surface through a glass window, and a temperature fluctuation period of crystal melt is measured.

According to the present invention, when a single crystal is grown as described above, it is important to control a growth rate and/or a temperature fluctuation period so that $V \times F/\sin \theta$ may be in a certain range when a growth rate at the time of growing a single crystal is defined as V (mm/min), a temperature fluctuation period of crystal melt is defined as F (min), and an angle to the level surface of a crystal-growth interface is defined as $\theta$.

Figure 6:
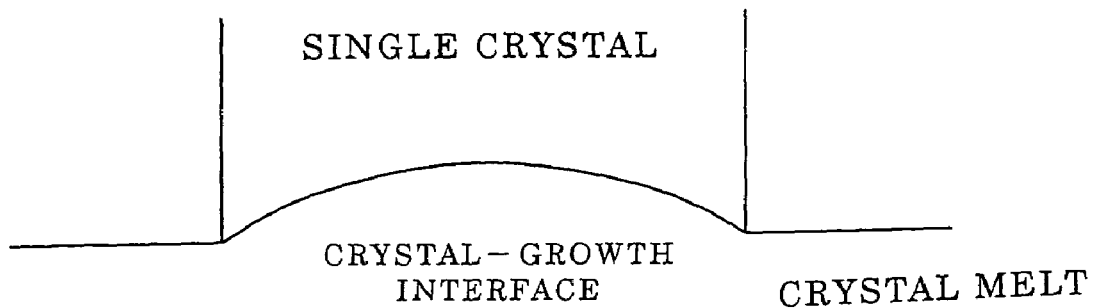
FIG. 6 is a view which schematically shows a crystal-growth interface at the time of growing a single crystal.
Figure 7:
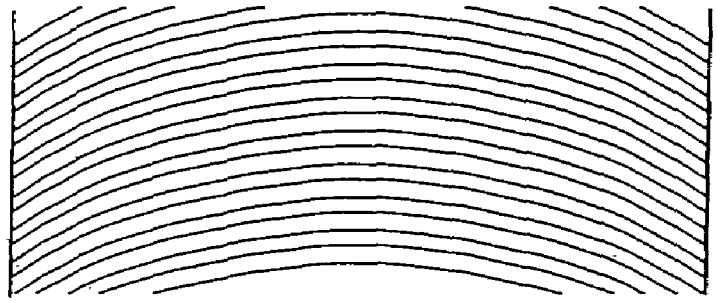
FIG. 7 is a sectional view of a single crystal which schematically shows a condition wherein a temperature fluctuation of a crystal melt is incorporated in a single crystal as striations.

Usually, a configuration of a crystal-growth interface is a convex configuration as shown in FIG. 6 when a single crystal is grown according to the single crystal pulling method as mentioned above. Therefore, minute temperature fluctuation of crystal melt within a crucible is incorporated in a single crystal, and striations as shown in FIG. 7 are generated. At this time, an interval d of striations is represented by $d=V \times F$, which is the product of a growth rate V of a single crystal and a temperature fluctuation period F of crystal melt.

Figure 8:
FIG. 8 is a sectional view which schematically expresses a wafer cut from the single crystal of FIG. 7.
Figure 9:
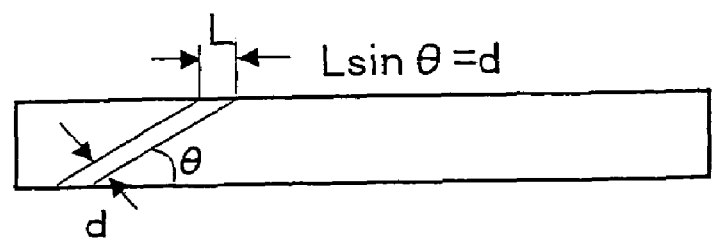
FIG. 9 is a view which schematically expresses the interval L of the striations on the surface of a wafer.

When a single crystal wafer is cut from the single crystal in which the striations as shown in FIG. 7 are formed, striations as shown in FIG. 8 will be formed in the produced single crystal wafer. When an interval of the striations on the surface of the wafer is defined as L at this time (FIG. 9), the interval L of the striations is represented as $L=d/\sin \theta=V \times F/\sin \theta$ using an angle $\theta$ to the level surface of the crystal-growth interface. In addition, the configuration of a crystal-growth interface has curvature as shown in FIG. 6. Therefore, if measurement is conducted strictly, the values of the interval L of striations are different along the radial direction of a wafer even in the same wafer surface. However, since the difference is very small to the value of L, the interval of the striations on the whole surface of the wafer can be obtained as $L=V \times F/\sin \theta$ as a representative value even if there is curvature in the configuration of a crystal-growth interface.

According to the research by the inventors of the present invention, it has been revealed that the nanotopology characteristics of a single crystal wafer is degraded when the interval L of the striations is close to the size of the measurement area at the time of measurement of nanotopology characteristics, as described above. Accordingly, when a single crystal is grown, degradation of the nanotopology characteristics can be prevented by controlling a growth rate of a single crystal V and/or a temperature fluctuation period of crystal melt F so that the interval L of the striations on the surface of the wafer, that is, the value of $V \times F/\sin \theta$ may be in a different range from a size of the measurement area when nanotopology is measured.

The current method for measurement of nanotopology is mainly performed in the area of a 2 mm×2 mm square as mentioned above. Therefore, in order to improve the nanotopology characteristics in this 2 mm×2 mm square area, it is important that the interval L of the striations in the plane perpendicular to an axis of crystal-growth, i.e., $V \times F/\sin \theta$, does not come to the value around 2 mm in the single crystal to be grown. Especially, it is preferable to grow a single crystal with controlling a growth rate V and/or the temperature fluctuation period F, so that $V \times F/\sin \theta$ may be in the range of 1.5 mm or less or 2.3 mm or more. It was experimentally confirmed that if it is done so, the nanotopology level of 14 nm or less can be obtained when the wafer is produced (FIG. 1).

In addition, the above-mentioned range of $V \times F/\sin \theta$ is for preventing degradation of nanotopology characteristics at the time of measurement of nanotopology in the area of the 2 mm×2 mm square as performed currently, and the range of $V \times F/\sin \theta$ in the present invention is not limited thereto. That is, when the measurement area of nanotopology changes according to formal standard, progress of technology, or the like in the future, naturally the range of $V \times F/\sin \theta$ can be appropriately changed depending on the measurement area of the nanotopology in the present invention, and thereby degradation of nanotopology characteristics can be prevented.

At this time, control of the growth rate V of a single crystal can be performed by controlling a pulling rate at the time of pulling a single crystal. On the other hand, control of the temperature fluctuation period F of crystal melt can be easily performed by controlling, for example, any one or more items of an intensity of magnetic field to be impressed to crystal melt, a crucible rotation rate, a single crystal rotation rate, a gas flow rate, and an amount of crystal melt.

Figure 5:
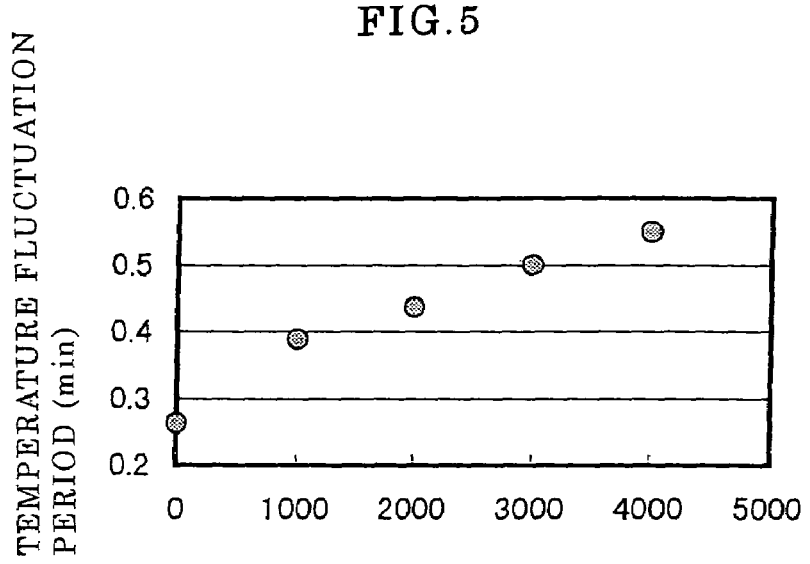
FIG. 5 is a graph showing the relation between an intensity of magnetic field and a temperature fluctuation period of a crystal melt.

Especially the temperature fluctuation period can be easily controlled with high precision by controlling the intensity of magnetic field impressed to crystal melt. Actually, after charging 320 kg of silicon raw material, dissolving it using the apparatus for growing a single crystal (a crucible with a diameter of 800 mm is equipped) shown in FIG. 10, a temperature of a surface of a silicon melt was measured using a radiation thermometer under the state just before a silicon single crystal is grown. At this time, an intensity of a horizontal magnetic field at the center was changed from 0 G to 4000 G, and the temperature fluctuation period on the surface of a melt was measured. The result is as follows, as shown in FIG. 5: F=0.26 min at 0 G, 0.39 min at 1000 G, 0.44 min at 2000 G, 0.50 min at 3000 G, and 0.55 min at 4000 G, and the temperature fluctuation period changed according to change of the intensity of magnetic-field. From these results, it has been confirmed that the temperature fluctuation period of crystal melt can be controlled with high precision by controlling the intensity of magnetic field impressed to crystal melt. Therefore, the interval L of the striations in a plane of a wafer can be controlled with high precision by controlling an intensity of magnetic field. As a result, nanotopology can be significantly improved.

As described above, the single crystal wherein the interval of the striations incorporated into a single crystal due to the temperature fluctuation of the melt of a crystal at the time of growing a crystal is controlled can be produced by using the method of growing a single crystal of the present invention. If it is the single crystal wherein the interval of the striations due to a crystal-growth is controlled, it can be the single crystal from which a single crystal wafer excellent in nanotopology characteristics can be cut. That is, according to the present invention, it becomes possible to improve the nanotopology characteristics of a wafer by controlling single-crystal-growth conditions rather than controlling the processing conditions on the surface of a wafer like before.

Furthermore, according to the present invention, even if the single crystal to be grown is silicon and with low resistivity 0.1 Ω·cm or less wherein boron, phosphorus, or the like is doped in silicon, degradation of nanotopology characteristics which is especially serious in general as to a single crystal with low resistivity can be surely prevented by controlling the interval of the striations incorporated into a single crystal as described above. Therefore, it becomes possible to grow a silicon single crystal with low resistivity from which a wafer which is excellent in gettering capacity and is very excellent also in nanotopology characteristics can be obtained. Although the minimum of resistivity at this time is not limited, for example, the resistivity of the single crystal wherein dopant such as boron, phosphorus or the like is doped up to a solid solubility limit is the lower limit.

Moreover, according to the present invention, a diameter of a single crystal is 200 mm or more, and nanotopology characteristics can be improved by making a growth rate faster to some extent. As described above, if nanotopology characteristics is improved by making a growth rate faster, improvement not only in respect of quality but also in productivity can be achieved.

Moreover, after growing a single crystal by the above-mentioned method of growing a single crystal of the present invention, a single crystal wafer can be manufactured by cutting the single crystal and subjecting it to processes such as lapping, chamfering, polishing or the like as performed conventionally.

The single crystal wafer can be a high quality wafer which is excellent in nanotopology characteristics. Especially, when the nanotopology level in the area of a 2 mm×2 mm square is measured all over the surface of the wafer, it can be the single crystal wafer wherein the average of the maximum values achieves a good level as 14 nm or less.

Furthermore, an epitaxial wafer can be manufactured by forming an epitaxial layer on the surface of the single crystal wafer. If it is such an epitaxial wafer, the nanotopology characteristics of the epitaxial wafer are also excellent since the nanotopology characteristics of the single crystal wafer used as a substrate are excellent. Especially, when the nanotopology level in the area of a 2 mm×2 mm square of the epitaxial wafer is measured all over the surface of the wafer, it can be the wafer wherein the average of the maximum achieves a good level as 14 nm or less.

Moreover, the such epitaxial wafer excellent in nanotopology characteristics is excellent in thickness uniformity of an epitaxial layer. Furthermore, since there is less generation of the internal stress (distortion) due to unevenness between the surface of a single crystal wafer and an epitaxial layer, a slip line is not generated in an epitaxial layer. Therefore, it is strong in a thermal mechanical strength in manufacture of the device, and has a high gettering capacity especially by using a single crystal wafer with low resistivity of 0.1 Ω·cm or less as a substrate. Therefore, a high yield in an LSI device can be expected.

In addition, the present invention was above explained, focusing on a temperature fluctuation period as to a temperature fluctuation of crystal melt. However, based on fundamental discovery of the present invention, it is possible to improve the nanotopology characteristics of a single crystal wafer also by making the range of temperature fluctuation of crystal melt small.

Although the present invention is explained more concretely referring to Examples and Comparative Examples, the present invention is not limited to them.

Figure 2:
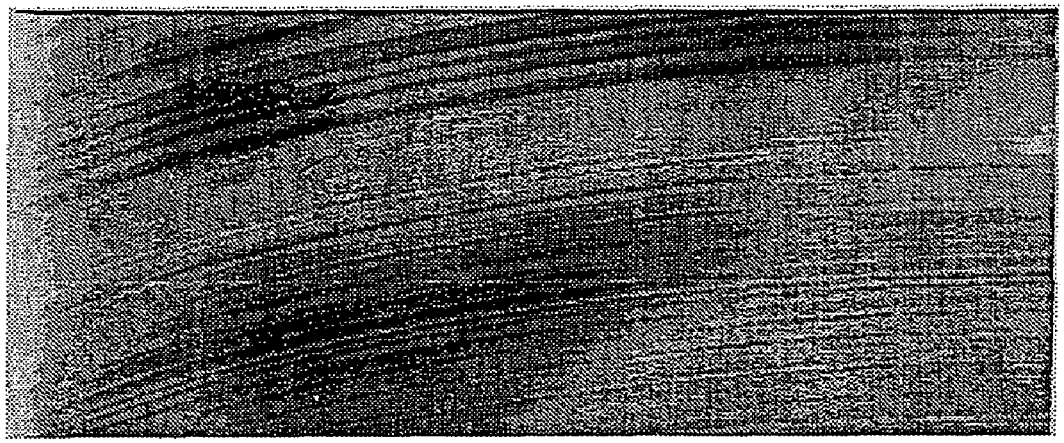
FIG. 2 is a view showing the result (only radius portion) of observation of a vertically divided sample of a single crystal by X-ray topography, for investigating a configuration of a crystal-growth interface.

In addition, in the following Examples and Comparative Examples, nanotopology is measured in the area of a 2 mm×2 mm square. Moreover, the following observation by X-ray topography was performed in advance in order to investigate the crystal-growth interface configuration in the case of growing the silicon single crystal with the same diameter with the apparatus for growing a single crystal used here, i.e., the angle θ to the level surface of a crystal-growth interface. First, after a single crystal was grown with changing a growth rate and intensity of magnetic field, the single crystal was sliced along a direction of an axis of crystal-growth to produce a vertically divided sample, and then it was subjected to the precipitation heat treatment at 800° C. for 4 hours and at 1000° C. for 16 hours. Then, the heat-treated vertically divided sample was observed by X-ray topography. The observation result is shown in FIG. 2 (only radius portion). It was revealed that θ=10 and there was almost no fluctuation from θ=10, as a result of determining angle θ to the level surface of a crystal-growth interface from the observation result by the X-ray topography.

EXAMPLE 1

First, using the apparatus for growing a single crystal (a quartz crucible with a diameter of 800 mm is equipped) shown in FIG. 10, 320 kg of the silicon raw material was charged to the quartz crucible, a silicon single crystal with a diameter of 300 mm and a body length of about 120 cm was grown with impressing a horizontal magnetic field at a central intensity of magnetic field of 4000 G. At this time, the resistivity of the single crystal was made 0.006-0.009 Ω·cm by doping boron. At this time, the temperature fluctuation periods at 4000 G of the intensity of magnetic field is 0.55 min from the relation between an intensity of magnetic field and a temperature fluctuation period shown in FIG. 5. And a growth rate was controlled to 0.44 mm/min. Then, the value of V×F/sin θ in Example 1 was made so that V×F/sin θ=0.44×0.55/sin 10=1.39 (mm).

A silicon wafer was cut from the silicon single crystal thus grown, and nanotopology was measured in the area of a 2 mm×2 mm square. In general, the more the amount of a silicon melt is, the stronger the heat convection and the larger temperature fluctuation becomes. Therefore, the striations due to temperature fluctuation of a melt tends to be influenced more at earlier stage of growth of a single crystal. Therefore, in this Example, 50 silicon wafers cut from the range of 10-15 cm from a shoulder part of a single crystal were produced, and their nanotopology was measured. Consequently, the average of the maximum of the nanotopology level in the area of a 2 mm×2 mm square of 50 silicon wafers were a good value as 13.3 nm, and it was revealed that the nanotopology characteristics were excellent.

EXAMPLE 2

Using the same apparatus for growing a single crystal as used in Example 1, a silicon single crystal with a diameter of 300 mm and a body length of about 120 cm was grown with impressing a horizontal magnetic field at a central intensity of magnetic field of 3000 G. At this time, the same as in Example 1, the resistivity of a single crystal was made 0.006-0.009 Ω·cm. At this time, the temperature fluctuation period at 3000 G of the intensity of magnetic field is 0.50 min. And a growth rate was controlled to 0.92 mm/min. Therefore, the value of V×F/sin θ in Example 2 was made so that V×F/sin θ=0.92× 0.50/sin 10=2.65 (mm).

Figure 3:
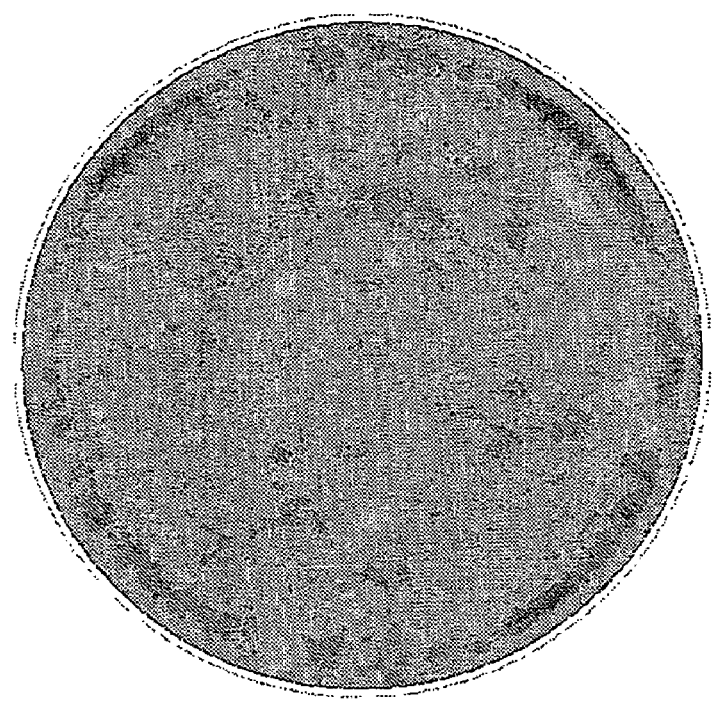
FIG. 3 is a view showing the result of measurement of nanotopology of the wafer in Example 2 as a map.

50 silicon wafers cut from the range of 10-15 cm from the shoulder section of the silicon single crystal thus grown were produced, and their nanotopology was measured. As a result, the average of the maximum of nanotopology level are a very good value as 11.4 nm, and nanotopology characteristics were very excellent. Moreover, the result of measurement of the nanotopology of the produced silicon wafer was shown in FIG. 3 as a map. As shown in FIG. 3, it was revealed that the striation due to crystal on the surface of the wafer was not observed strongly in the silicon wafers of Example 2, and the unevenness on the surface of the wafer is small.

Furthermore, an epitaxial layer was formed on the surface of this silicon wafer and an epitaxial wafer was produced. Then, the nanotopology of the epitaxial wafer was measured. It was revealed that nanotopology level of it was almost equivalent to those of the above silicon wafers, and that nanotopology characteristics of the epitaxial wafer were very excellent.

EXAMPLE 3

Using the same apparatus for growing a single crystal as above, a silicon single crystal with a diameter of 300 mm and a body length of about 120 cm was grown without impressing a magnetic field. At this time, the resistivity of the single crystal was made 0.006-0.009 Ω·cm. At this time, the temperature fluctuation period at 0 G of the intensity of magnetic field is 0.26 min. And a growth rate was controlled to 0.82 mm/min. Therefore, the value of V×F/sin θ in Example 3 was made so that V×F/sin θ=0.82×0.26/sin 10=1.23 (mm).

50 silicon wafers cut from the range of 10-15 cm from the shoulder section of the silicon single crystal thus grown were produced, and their nanotopology was measured. As a result, the average of the maximum of nanotopology level was a very good value as 12.3 nm, and nanotopology characteristics were excellent.

COMPARATIVE EXAMPLE 1

Using the same apparatus for growing a single crystal as used in above Examples, a silicon single crystal with a diameter of 300 mm and a body length of about 120 cm was grown with impressing a horizontal magnetic field at a central intensity of magnetic field of 4000 G. At this time, the same as in Examples, the resistivity of a single crystal was made 0.006-0.009 Ω·cm. At this time, a growth rate was controlled to 0.55 mm/min, and the value of V×F/sin θ was made so that V×F/sin θ=0.55×0.55/sin 10=1.74 (mm). This value is close to 2 mm which is to be the measurement area of nanotopology at this time.

Figure 4:
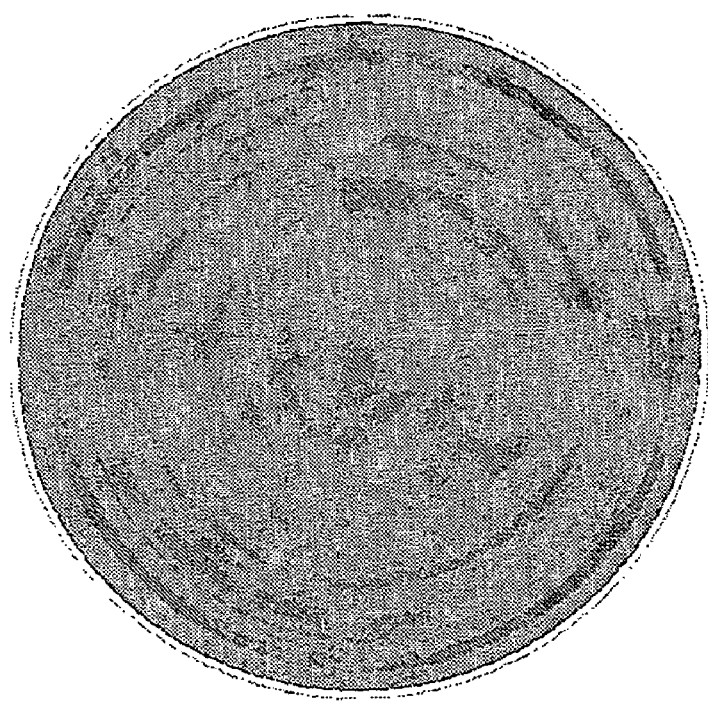
FIG. 4 is a view showing the result of measurement of nanotopology of the wafer in Comparative Example 1 as a map.

50 silicon wafers cut from the range of 10-15 cm from the shoulder section of the silicon single crystal thus grown were produced, and their nanotopology was measured. As a result, the average of the maximum of nanotopology level was very large as 14.7 nm, and nanotopology characteristics were deteriorated. The result of measurement of the nanotopology of the produced silicon wafer was shown in FIG. 4 as a map. The striations due to a crystal on the surface of the wafer were observed strongly, and the unevenness on the surface of the wafer was confirmed clearly.

COMPARATIVE EXAMPLE 2

Using the same apparatus for growing a single crystal as above, a silicon single crystal with a diameter of 300 mm and a body length of about 120 cm was grown with impressing a horizontal magnetic field at a central intensity of magnetic field of 4000 G. At this time, the resistivity of a single crystal was made 0.006-0.009 Ω·cm. At this time, a growth rate was controlled to 0.63 mm/min, and the value of V×F/sin θ was made so that V×F/sin θ=0.63×0.55/sin 10=1.99 (mm). This value is almost the same as the measurement area of nanotopology at this time.

50 silicon wafers cut from the range of 10-15 cm from the shoulder section of the silicon single crystal thus grown were produced, and their nanotopology was measured. As a result, the average of the maximum of nanotopology level was very large as 15.3 nm, and nanotopology characteristics were much deteriorated.

The results of the above-mentioned Examples 1-3 and Comparative Examples 1 and 2 were plotted in the graph of FIG. 1 with setting V×F/sin θ to a horizontal axis and the measured nanotopology level to a vertical axis. As shown in FIG. 1, the nanotopology level of the wafer was most degraded at the point that V×F/sin θ is 2 mm, and nanotopology characteristics became better when the value of V×F/sin θ becomes smaller or larger than 2 mm. Furthermore, the average of the maximum of nanotopology showed 14 nm or less in the range that V×F/sin θ was 1.5 mm or less or 2.3 mm or more.

Moreover, it is very promising technology also from the point of the improvement in productivity that nanotopology can be improved by making a growth rate high as in Examples 2 and 3. When growing a single crystal with a large diameter of 200 mm or more, the crystal growth at high speed is difficult. Therefore, generally it is grown at the growth rate range which is a little slow rate of crystal growth as in Comparative Examples 1 and 2 in many cases. Therefore, if a growth rate is made high and nanotopology characteristics are improved as in Examples 2 and 3, not only improvement in quality but also improvement in productivity can be achieved.

The present invention is not limited to the above-described embodiment. The above-described embodiment is a mere example, and those having the substantially same structure as that described in the appended claims and providing the similar action and effects are included in the scope of the present invention.

For example, in the embodiments of the present invention, a single crystal with a diameter of 300 mm was grown. However, the present invention is not limited thereto. The present invention also meets to growing a single crystal with a diameter of 200 mm, 400 mm or more.

The invention claimed is:

1. A silicon single crystal manufactured by a single crystal pulling method, wherein an interval of striations incorporated into the single crystal due to temperature fluctuation of crystal melt at the time of crystal growth is controlled, the interval of striations is in a range of 1.5 mm or less or 2.3 mm or more in a plane perpendicular to an axis of crystal growth, the resistivity of the single crystal is 0.1 Ω·cm or less, and nanotopology characteristics are controlled.

2. The single crystal according to claim 1, wherein a diameter of the silicon single crystal is 200 mm or more.

3. A single crystal wafer which is cut from the single crystal according to claim 1.

4. The single crystal wafer according to claim 3, wherein an average of the maximum of the nanotopology level in the area of a 2 mm×2 mm square is 14 nm or less over the whole surface of the single crystal wafer.

5. An epitaxial wafer, wherein an epitaxial layer is formed on the surface of the single crystal wafer according to claim 3.

6. The epitaxial wafer according to claim 5, wherein an average of the maximum of the nanotopology level in the area of a 2 mm×2 mm square is 14 nm or less over the whole surface of the wafer of the epitaxial wafer.

7. A method of growing a silicon single crystal according to a single crystal pulling method, wherein a growth rate and/or a temperature fluctuation period are controlled so that V×F/sin θ is in a certain range when a growth rate at the time of growing a single crystal is defined as V (mm/mm), a temperature fluctuation period of crystal melt is defined as F (mm), an angle to the level surface of a crystal-growth interface is defined as θ, and a resistivity of the single crystal silicon is set to 0.1 Ω·cm or less.

8. The method of growing a single crystal according to claim 7, wherein the single crystal is grown so that the above-mentioned V×F/sin θ is in the range of 1.5 mm or less or 2.3 mm or more.

9. The method of growing a single crystal according to claim 7, wherein the control of the temperature fluctuation period of crystal melt is conducted by controlling any one item or more of an intensity of magnetic field to be impressed to crystal melt, a crucible rotation rate, a single crystal rotation rate, a gas flow rate, and an amount of crystal melt.

10. The method of growing a single crystal according to claim 8, wherein the control of the temperature fluctuation period of crystal melt is conducted by controlling any one item or more of an intensity of magnetic field to be impressed to crystal melt, a crucible rotation rate, a single crystal rotation rate, a gas flow rate, and an amount of crystal melt.

* * * * *